US012696806B2

(12) United States Patent
Park et al.

(10) Patent No.: US 12,696,806 B2
(45) Date of Patent: Jul. 28, 2026

(54) METHOD FOR MANUFACTURING SEMICONDUCTOR LIGHT-EMITTING DEVICE PACKAGE, SEMICONDUCTOR LIGHT-EMITTING DEVICE PACKAGE MANUFACTURED THEREBY, AND DISPLAY DEVICE COMPRISING SAME

(71) Applicant: LG ELECTRONICS INC., Seoul (KR)

(72) Inventors: Joodo Park, Seoul (KR); Hooyoung Song, Seoul (KR); Myungshin Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 536 days.

(21) Appl. No.: 18/028,606

(22) PCT Filed: Sep. 28, 2020

(86) PCT No.: PCT/KR2020/013207
§ 371 (c)(1),
(2) Date: Mar. 27, 2023

(87) PCT Pub. No.: WO2022/065556
PCT Pub. Date: Mar. 31, 2022

(65) Prior Publication Data
US 2023/0361095 A1 Nov. 9, 2023

(51) Int. Cl.
*H10W 90/00* (2026.01)
*H10H 20/01* (2025.01)
(Continued)

(52) U.S. Cl.
CPC .......... *H10W 90/00* (2026.01); *H10H 20/018* (2025.01); *H10H 20/816* (2025.01);
(Continued)

(58) Field of Classification Search
CPC . H01L 25/167; H01L 25/0753; H10H 20/018; H10H 20/816; H10H 20/83;
(Continued)

(56) References Cited

U.S. PATENT DOCUMENTS 10,629,689 B1 * 4/2020 Raring .................. H01S 5/0217
2010/0317132 A1 * 12/2010 Rogers ................... H01L 25/50
257/E33.059
(Continued)

FOREIGN PATENT DOCUMENTS

KR 10-1937036 B1 4/2019
KR 10-2137014 B1 7/2020

*Primary Examiner* — Ratisha Mehta
*Assistant Examiner* — Sophia W Kao
(74) *Attorney, Agent, or Firm* — Birch, Stewart, Kolasch & Birch, LLP

(57) ABSTRACT

Embodiments relate to a method for manufacturing a semiconductor light emitting device package, a semiconductor light emitting device package manufactured by the method, and a display device including the same. The semiconductor light emitting device package according to the embodiment can include a first semiconductor layer on a growth substrate, a tether layer on the first semiconductor layer, a light emitting structure on the tether layer, a light-transmitting electrode layer on the light-emitting structure, and a post structure on the light-transmitting electrode layer.

10 Claims, 10 Drawing Sheets

(51) Int. Cl.
  H10H 20/816          (2025.01)
  H10H 20/83           (2025.01)
  H10H 20/84           (2025.01)

(52) U.S. Cl.
  CPC ............  H10H 20/83 (2025.01); H10H 20/84
                   (2025.01); *H10H 20/036* (2025.01)

(58) Field of Classification Search
  CPC .... H10H 20/84; H10H 20/036; H10H 20/819;
           H10H 20/833; H10H 20/01; H10H
                20/857; H10H 20/0133
  See application file for complete search history.

(56)                    References Cited

U.S. PATENT DOCUMENTS

2016/0013170 A1*   1/2016  Sakariya ................. H01L 24/75
                                                          257/13
2018/0204973 A1*   7/2018  Jeung ................... H10H 20/825

* cited by examiner

[FIG. 1]

[FIG. 2]
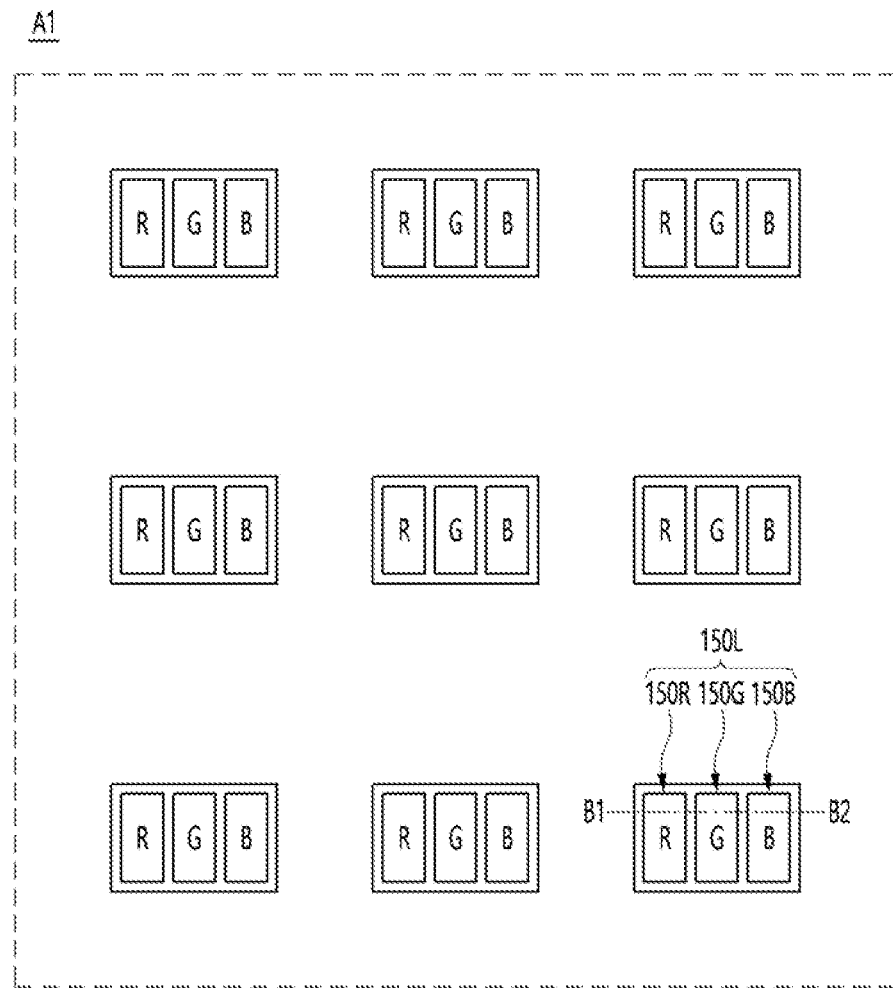
[FIG. 3]

[FIG. 4A]
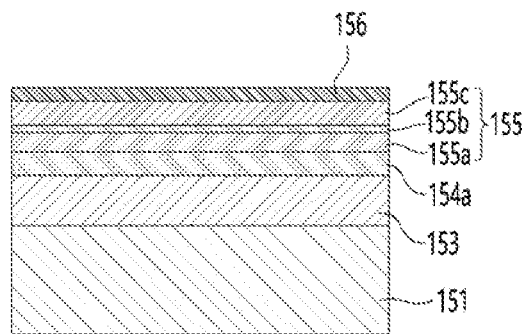
[FIG. 4B]
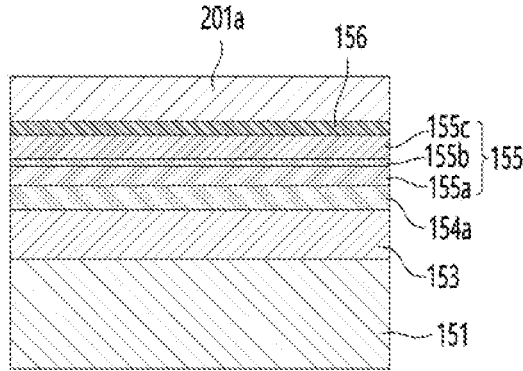
[FIG. 4C]
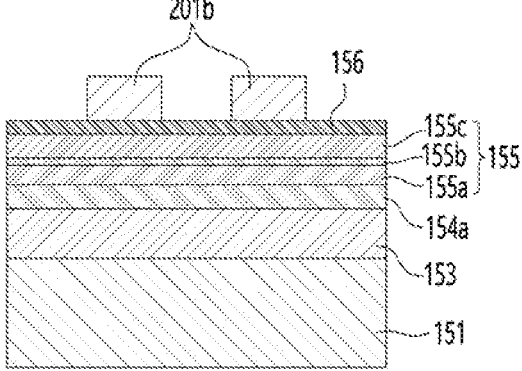

[FIG. 4D]
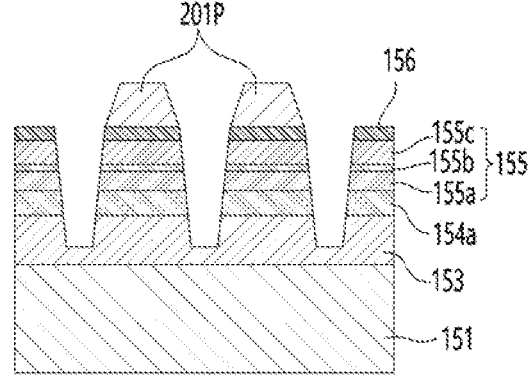
[FIG. 4E]
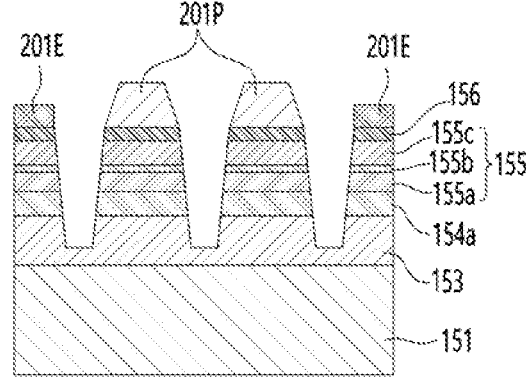
[FIG. 4F]
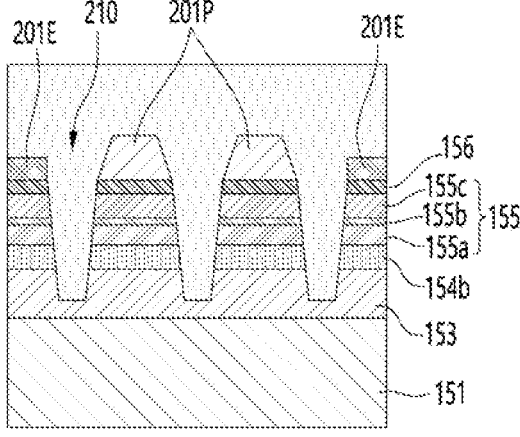

[FIG. 4G]
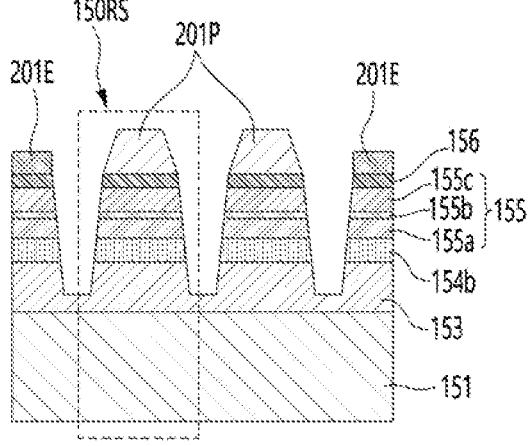
[FIG. 5]
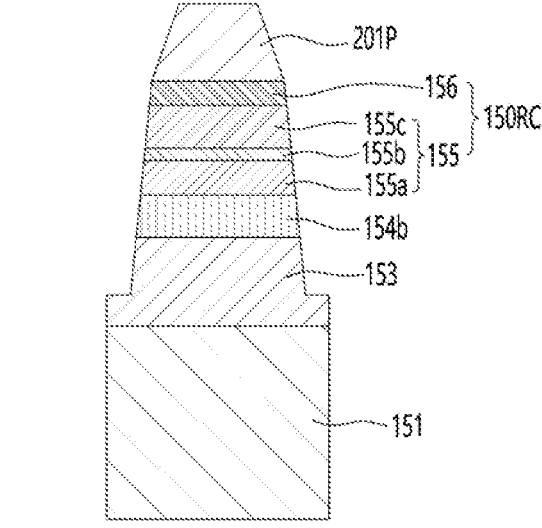
[FIG. 6A]
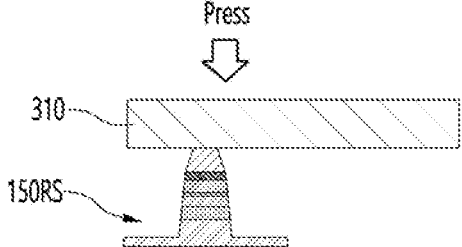

[FIG. 6B]
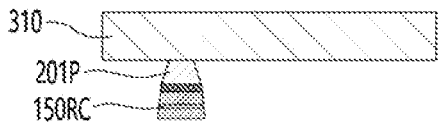
[FIG. 6C]
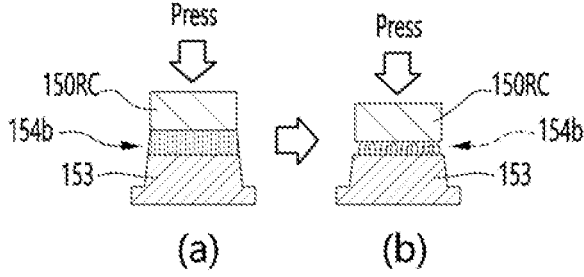
[FIG. 6D]
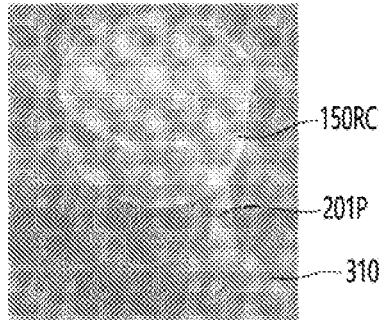
[FIG. 7A]
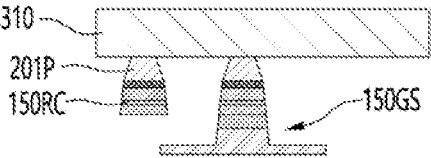
[FIG. 7B]
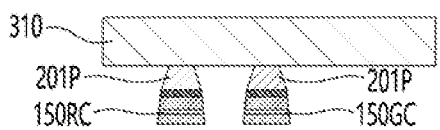

[FIG. 7C]
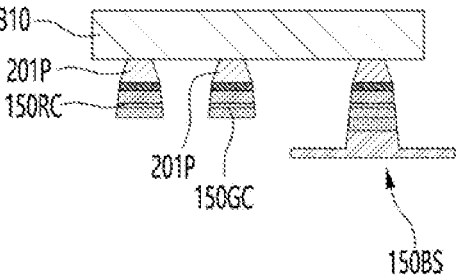
[FIG. 7D]
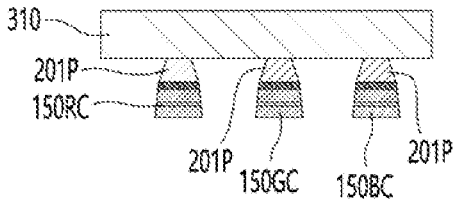
[FIG. 8]
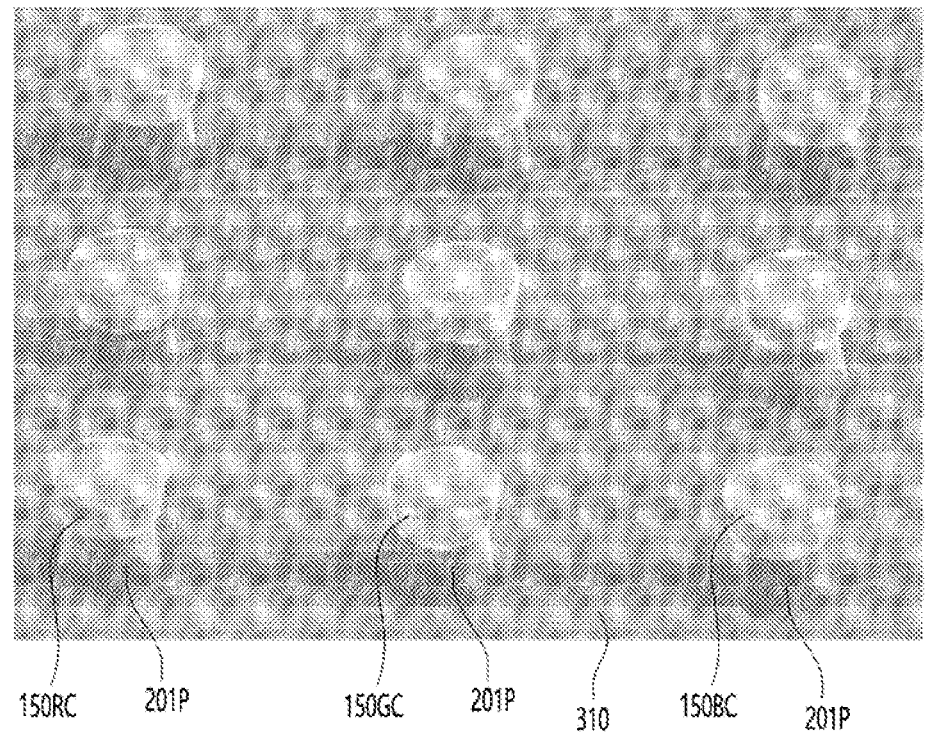

[FIG. 9a]
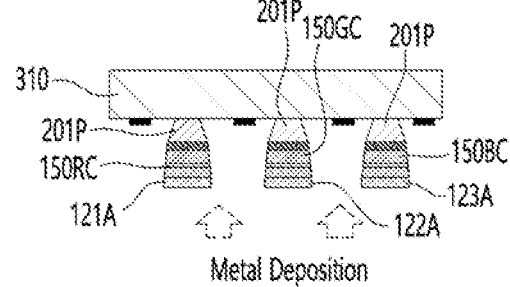
[FIG. 9b]
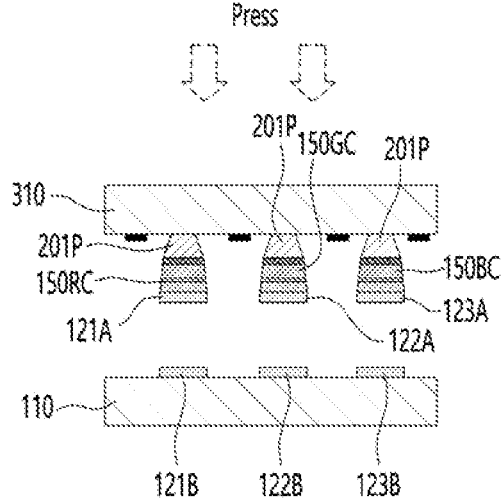
[FIG. 9c]
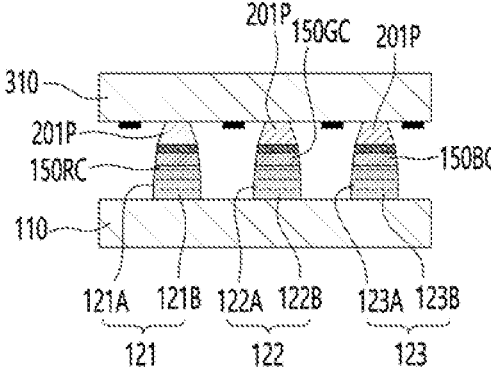

[FIG. 9d]
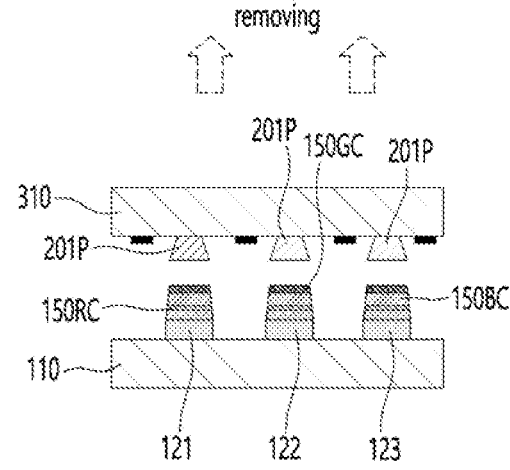
[FIG. 9e]
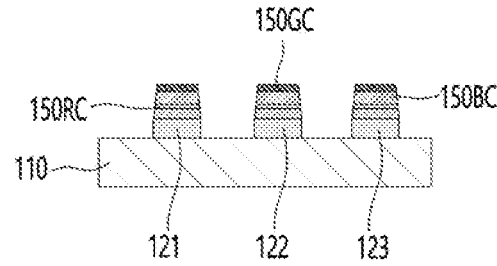
[FIG. 10a]
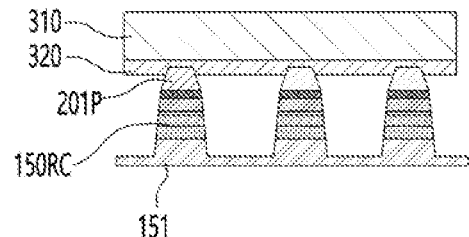
[FIG. 10b]
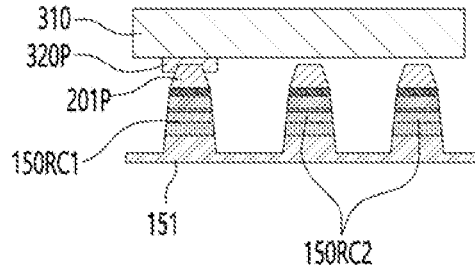

[FIG. 10c]
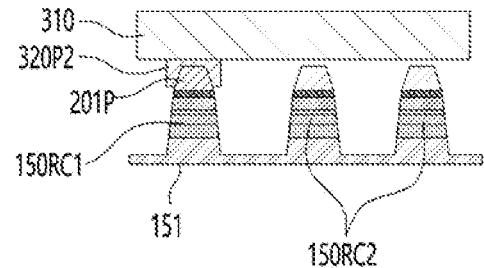
[FIG. 10d]
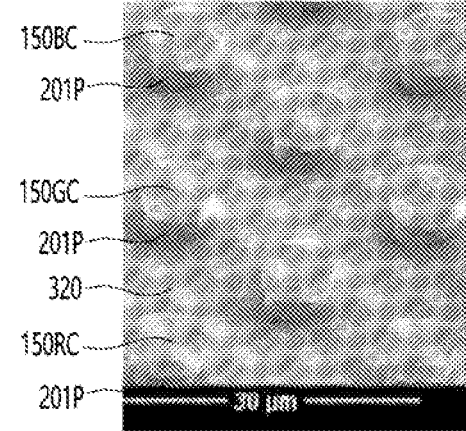

1

METHOD FOR MANUFACTURING SEMICONDUCTOR LIGHT-EMITTING DEVICE PACKAGE, SEMICONDUCTOR LIGHT-EMITTING DEVICE PACKAGE MANUFACTURED THEREBY, AND DISPLAY DEVICE COMPRISING SAME

CROSS REFERENCE TO RELATED APPLICATIONS

This application is the National Phase of PCT International Application No. PCT/KR2020/013207, filed on Sep. 28, 2020, which is hereby expressly incorporated by reference into the present application.

BACKGROUND

Technical Field

Embodiment relates to a method for manufacturing a semiconductor light emitting device package, a semiconductor light emitting device package manufactured by the method, and a display device including the same.

Discussion of the Related Art

Technologies for implementing large-area displays include liquid crystal displays (LCD), OLED displays, and Micro-LED displays.

A micro-LED display is a display using a micro-LED, which is a semiconductor light emitting device having a diameter or cross-sectional area of 100 µm or less, as a display device.

Since the micro-LED display uses micro-LED, which is a semiconductor light emitting device, as a display device, micro-LED displays have excellent performance in many characteristics, such as contrast ratio, response speed, color reproduction rate, viewing angle, brightness, resolution, lifespan, luminous efficiency or luminance.

In particular, the micro-LED display has the advantage of being able to freely adjust the size or resolution as the screen can be separated and combined in a modular manner, and can implement a flexible display.

However, since a large-scale micro-LED display requires millions of micro-LEDs, there is a technical problem in that it is difficult to quickly and accurately transfer micro-LEDs to a display panel.

Recently developed transfer technology includes a pick and place process, a laser lift-off method (LLO), or a self-assembly method.

On the other hand, LED chips applied to high-resolution displays such as AR and VR are being miniaturized in size, and conventional pick-and-place techniques have problems with transfer and transmission, there is a need for a technology to efficiently transfer and transmit a subminiature LED chip.

Also, in the prior art, a metal process for forming an electrode layer is in progress for a subminiature LED chip, since the size of the LED chip is very small, it is difficult to perform a precise metal process, and there is a problem in that an electrical short occurs due to contact between metal layers deposited on the LED chip.

On the other hand, in the prior art, when a thin metal layer is formed to prevent metal-to-metal contact on a subminiature LED chip, a contradiction arises in that electrical characteristics are deteriorated.

2

SUMMARY

One of the technical objects of the embodiment is to provide a method for manufacturing a semiconductor light emitting device package, a semiconductor light emitting device package manufactured by the method, and a display device including the same capable of efficiently transferring and transmitting in a subminiature LED chip applied to high resolution displays such as AR and VR.

Also, one of the technical objects of the embodiment is to provide a method for manufacturing a semiconductor light emitting device package, a semiconductor light emitting device package manufactured by the method, and a display device including the same in which a metal layer is formed to have excellent electrical characteristics without an electrical short on the LED chip even if it is a subminiature LED chip.

The technical objects of the embodiment are not limited to those described in this section, and include those that can be grasped through the description of the invention.

The manufacturing method of the semiconductor light emitting device package according to the embodiment can include a step of manufacturing a first semiconductor light emitting device including a post structure on a light emitting structure and a step of transferring the first semiconductor light emitting device including the post structure onto a donor substrate and removing the growth substrate by breaking the tether layer of the first semiconductor light emitting device including the post structure.

In the step of manufacturing the first semiconductor light emitting device including the post structure, A step of sequentially forming a first semiconductor layer on the growth substrate, a second semiconductor layer on the first semiconductor layer, a light emitting structure on the second semiconductor layer, and a light-transmitting electrode layer on the light emitting structure, a step of forming a mask pattern on the light-transmitting electrode layer, a step of etching portions of the light-transmitting electrode, the light-emitting structure, the second semiconductor layer, and the first semiconductor layer and forming the mask pattern into a post structure, a step of forming an etching electrode on the light-transmitting electrode layer without the post structure; and a step of selectively partially etching the second semiconductor layer by performing EC (Electrical Chemical) etching to form a tether layer can be included.

The first semiconductor layer and the second semiconductor layer are each doped with a first conductivity type dopant, and a doping concentration of the first conductivity type dopant of the second semiconductor layer can be higher than that of the first conductivity type dopant of the first semiconductor layer.

In the step of removing the growth substrate by damaging the tether layer of the first semiconductor light emitting device including the post structure, after the first semiconductor light emitting device including the post structure is disposed on the donor substrate, as a predetermined pressure is applied to the donor substrate, a first semiconductor light emitting device chip structure including the post structure can remain on the donor substrate by removing the growth substrate due to damage to the tether layer of the first semiconductor light emitting device.

The embodiment can further include forming a first-A electrode layer on the light emitting structure exposed after removing the growth substrate.

In the step of forming the first-A electrode layer on the light emitting structure, the light emitting structure includes a first conductivity type semiconductor layer, an active layer, and a second conductivity type semiconductor layer, a horizontal width of the first conductivity type semiconductor layer of the light emitting structure can be greater than a horizontal width of the second conductivity type semiconductor layer, and the first-A electrode layer can be formed on the first conductivity type semiconductor layer.

In the embodiment, the first conductivity type semiconductor layer exposed after the tether layer is removed can have roughness on an exposed surface.

The embodiment can further include bonding the first semiconductor light emitting device chip structure including the first-A electrode layer onto the panel substrate including the first-B electrode layer.

The embodiment can further include separating the post structure from the light emitting structure.

The embodiment can further include a coating layer on the donor substrate.

The embodiment can further include a coating layer pattern on the donor substrate.

The semiconductor light emitting device package according to the embodiment can include a first semiconductor layer on a growth substrate, a tether layer on the first semiconductor layer, a light emitting structure on the tether layer, a light-transmitting electrode layer on the light-emitting structure, and a post structure on the light-transmitting electrode layer.

The semiconductor light emitting device package can be manufactured by any one of the above manufacturing methods.

The display device according to the embodiment can include a panel substrate including one or more wiring electrodes and any one of the semiconductor light emitting device packages disposed on the panel substrate.

Advantageous Effects

According to the manufacturing method of the semiconductor light emitting device package according to the embodiment, the semiconductor light emitting device package manufactured by the method, and a display device including the same, there is a technical effect that enables efficient transcription and transmission in ultra-small LED chips applied to high-resolution displays such as AR and VR.

Also, according to the embodiment, there is no need to manufacture a dedicated transfer head and a dedicated stamp due to the smaller chip size of the semiconductor light emitting device.

Also, according to the embodiment, all R, G, and B chips can be transferred to the donor substrate, and R, G, and B chips can be simultaneously metal bonded to the panel substrate, so there is a technical effect of improving the uniformity of the display.

Also, according to the embodiment, there is a technical effect capable of implement a small full-color display with high resolution by reducing the size and pitch of a semiconductor light emitting device chip.

Also, according to the embodiment, there is a technical effect in which a metal layer can be formed on the LED chip to have excellent electrical characteristics without an electrical short on the LED chip, even on a subminiature LED chip.

The technical effects of the embodiments are not limited to those described in this section, but include those that can be grasped from the description of the invention.

BRIEF DESCRIPTION OF THE DRAWINGS

FIG. 1 is an exemplary view in which a display device 100 according to an embodiment is disposed in a living room together with a washing machine 10, a robot cleaner 20, an air purifier 30, and the like.

FIG. 2 is an enlarged view of the first panel area A1 in the display device 100 of FIG. 1.

FIG. 3 is a cross-sectional view of the first semiconductor pixel region 150L1, which is one unit pixel in FIG. 2, taken along line B1-B2.

FIGS. 4A to 4G are cross-sectional views of processes for manufacturing the first semiconductor light emitting device 150R in the embodiment.

FIG. 5 is an enlarged cross-sectional view of the first semiconductor light emitting device 150RS including the post structure 201P on the growth substrate in FIG. 4G.

FIGS. 6A to 6D are diagrams illustrating a process of transferring the first semiconductor light emitting device 150RS including the post structure 201P shown in FIG. 5 to the donor substrate 310.

FIGS. 7A to 7D are process diagrams in which a second semiconductor light emitting device chip structure 150GC including the post structure 201P and a third semiconductor light emitting device chip structure 150BC including a post structure 201P on the donor substrate 310 is transferred.

FIG. 8 is a photograph of the first to third semiconductor light emitting device chip structures 150RC, 150GC, and 150BC including the post structure 201P coupled to the donor substrate 310 as shown in FIG. 7D.

FIGS. 9A to 9E are a process diagram of transferring the electrode layers to the panel substrate 110 after forming electrode layers for the first to third semiconductor light emitting device chip structures having the post structure 201P coupled to the donor substrate 310 shown in FIG. 7D.

FIGS. 10A to 10C are process diagrams of the transfer method according to the second embodiment, which is a process diagram in which the first semiconductor light emitting device chip structure 150RC including the post structure 201P is transferred onto the donor substrate 310 provided with the coating layer 320.

FIG. 10D is a photograph in which the post structure 201P of the first semiconductor light emitting device chip structure 150RC is inserted into the coating layer 320 of the donor substrate and combined.

DETAILED DESCRIPTION OF THE EMBODIMENTS

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, the accompanying drawings are for easy understanding of the embodiments disclosed in the present specification, and the technical spirit disclosed in the present specification is not limited by the accompanying drawings. Also, when an element, such as a layer, area, or substrate, is referred to as being 'on' another component, this includes that it is directly on the other element or there can be other intermediate elements in between.

The display device described in this specification can include a mobile phone, a smart phone, a laptop computer, a digital broadcasting terminals, a personal digital assistants (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a method for manufacturing a semiconductor light emitting device package according to an embodiment, a semiconductor light emitting device package manufactured by the method, and a display device including the same will be described.

Figure 1:
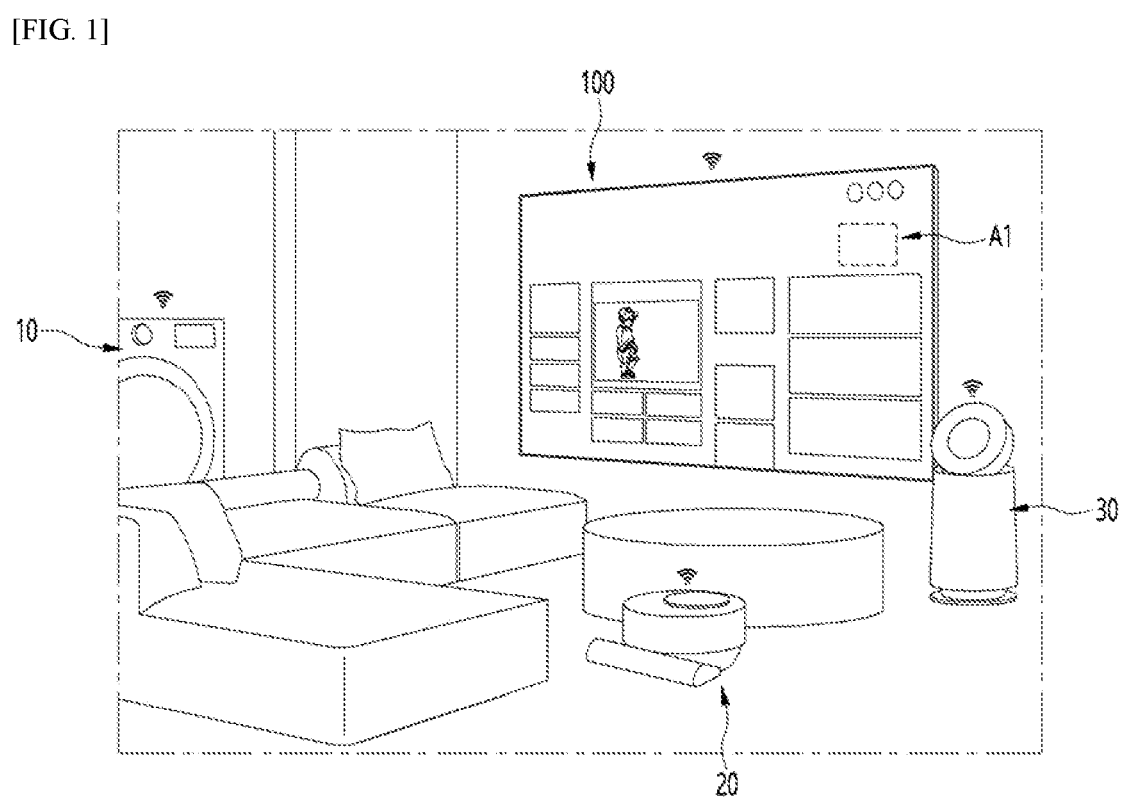

FIG. 1 is an exemplary view in which a display device 100 according to an embodiment is disposed in a living room together with a washing machine 10, a robot cleaner 20, and an air purifier 30.

The display device 100 of the embodiment can display the status of various electronic products such as the washing machine 10, the robot cleaner 20, and the air purifier 30, and can communicate with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for implementing one color. A unit pixel of the flexible display can be implemented by a semiconductor light emitting device. In the embodiment, the semiconductor light emitting device can be a Micro-LED, but is not limited thereto.

Next, FIG. 2 is an enlarged view of the first panel area A1 in the display device 100 of FIG. 1.

Referring to FIG. 2, the display device 100 of the embodiment can be manufactured by mechanically and electrically connecting a plurality of panel areas such as the first panel area A1 by tiling.

The first panel area A1 can include a plurality of unit pixels 150L, and each unit pixel 150L can include a first semiconductor light emitting device 150R, a second semiconductor light emitting device 150G, and a third semiconductor light emitting device 150B as sub-pixels.

The first, second, and third semiconductor light emitting elements 150R, 150G, and 150B can be a red light emitting element R, a green light emitting element G, and a blue light emitting element B, respectively, but are not limited thereto.

In an embodiment, each semiconductor light emitting device can be driven in an active matrix (AM) method or a passive matrix (PM) method.

Next, FIG. 3 is a cross-sectional view taken along line B1-B2 of the first semiconductor pixel region 150L1 that is one unit pixel in FIG. 2.

Referring to FIG. 3, in the display device 100 according to the embodiment, the first semiconductor pixel region 150L1 can include the panel substrate 110, the first wiring electrode 121, the second wiring electrode 122, the third wiring electrode 123, the first to third semiconductor light emitting devices 150R, 150G, and 150B disposed on the first to third wiring electrodes 121, 122, and 123, respectively, and the insulating layer 130 disposed between the semiconductor light emitting devices. The panel substrate 110, the first to third wiring electrodes 121, 122, and 123, and the first to third semiconductor light emitting devices 150R, 150G, and 150B can be referred to as a back plane, but is not limited thereto.

The panel substrate 110 can be formed of glass or polyimide. Also, the panel substrate 110 can include a flexible material such as polyethylene naphthalate (PEN) or polyethylene terephthalate (PET). Also, the panel substrate 110 can be a transparent material, but is not limited thereto.

A single or a plurality of wiring electrodes can be disposed on the panel substrate 110, and for example, first to third wiring electrodes 121, 122, and 123 can be disposed. The first to third wire electrodes 121, 122, and 123 can include a metal material having excellent electrical conductivity. For example, the first to third wiring electrodes 121, 122, and 123 can be formed of at least one of Titanium (Ti), Chromium (Cr), Nickel (Ni), Aluminum (Al), Platinum (Pt), Gold (Au), Tungsten (W) and Molybdenum (Mo) or an alloy thereof.

In the embodiment, the first wiring electrode 121 can include a first electrode layer 121A and a first electrode layer 121B. Also, the second wiring electrode 122 can include a second-A electrode layer 122A and a second-B electrode layer 122B. Also, the third wiring electrode 123 can include a third-A electrode layer 123A and a third-B electrode layer 123B.

An insulating layer 130 can be disposed between the first to third semiconductor light emitting devices 150R, 150G, and 150B on the panel substrate 110. The insulating layer 130 can include an insulating and flexible material such as polyimide, PEN, or PET, and can be integrated with the panel substrate 110 to form a single substrate.

The insulating layer 130 may be an adhesive insulating layer or a conductive adhesive layer having conductivity. Since the insulating layer 130 is ductile, the insulating layer can enable a flexible function of the display device.

Next, each of the semiconductor light emitting elements 150R, 150G, and 150B can be red, green, and blue semiconductor light emitting elements to form a unit-pixel, but are not limited thereto, and can implement red and green colors by including a red phosphor and a green phosphor, respectively.

Hereinafter, the first semiconductor light emitting device 150R will be mainly described, and the remaining second to third semiconductor light emitting devices 150G and 150B can also adopt the technical features of the first semiconductor light emitting device 150R.

The semiconductor light emitting devices 150R, 150G, and 150B that can be employed in the embodiment can be vertical type semiconductor light emitting devices as shown in FIG. 3, but are not limited thereto and can include a lateral type semiconductor light emitting device or a flip type semiconductor light emitting device.

In the embodiment, the semiconductor light emitting devices 150R, 150G, and 150B are p-n junction diodes in which electrical energy is converted into light energy, and can be made of compound semiconductors containing elements of groups III and V on the periodic table and can implement various colors such as red, green, and blue by controlling band gap energy by adjusting the composition ratio of compound semiconductors.

Next, FIGS. 4A to 4G are process cross-sectional views for manufacturing the first semiconductor light emitting device 150R in the embodiment, and FIG. 5 is an enlarged cross-sectional view of the first semiconductor light emitting device 150RS including the post structure 201P on the growth substrate manufactured by the above manufacturing method in FIG. 4G.

First, referring to FIG. 5, the first semiconductor light emitting device 150RS including the post structure 201P on the growth substrate can include a first semiconductor layer 153 on a growth substrate 151, a tether layer 154b on the first semiconductor layer 153, a light emitting structure 155 on the tether layer 154b, a light-transmitting electrode layer 156 on the light emitting structure 155 and a post structure 201P on the light-transmitting electrode layer 156.

The light emitting structure 155 can include a first conductivity type semiconductor layer 155a, an active layer 155b, and a second conductivity type semiconductor layer 155c.

The first conductivity type semiconductor layer 155a can be implemented as a group 3-group 5 compound semiconductor doped with a first conductivity type dopant. The active layer 155b is a layer in which electrons injected through the first conductivity type semiconductor layer 155a and holes injected through the second conductivity type semiconductor layer 113 meet each other to emit light having energy determined by the bandgap energy inherent to the active layer material. The second conductivity type semiconductor layer 155c can include a group III-group V compound semiconductor material doped with a second conductivity type dopant.

The first semiconductor layer 153 can be doped with a first conductivity type dopant.

The tether layer 154b can be a friable layer easily broken by a predetermined pressure, and can be referred to as a separating layer or an etched layer, but is not limited thereto.

The post structure 201P can be formed of a PR material and can be referred to as a contact layer, a support layer, or an anchor layer, but is not limited thereto.

Hereinafter, a method of manufacturing the first semiconductor light emitting device 150RS including the post structure 201P on the growth substrate shown in FIG. 5 will be described with reference to FIGS. 4A to 4G.

First, as shown in FIG. 4A, sequentially, a first semiconductor layer 153 is formed on the growth substrate 151, a second semiconductor layer 154a is formed on the first semiconductor layer 153, a light emitting structure 155 is formed on the second semiconductor layer 154a, and a light-transmitting electrode layer 156 is formed on the light emitting structure 155.

The growth substrate 151 is a substrate for growing an epitaxial layer, which is a light emitting structure, and can be a sapphire substrate or a silicon (Si) wafer, but is not limited thereto.

Each of the first semiconductor layer 153 and the second semiconductor layer 154a can be doped with a first conductivity type dopant. In this case, the doping concentration of the first conductivity type dopant of the second semiconductor layer 154a can be higher than that of the first conductivity type dopant of the first semiconductor layer 153.

Also, the doping concentration of the first conductivity type dopant of the second semiconductor layer 154a can be higher than that of the first conductivity type dopant of the first conductivity type semiconductor layer 155a.

Accordingly, in the subsequent etching process, the etching rate for the second semiconductor layer 154a is high, so that the tether layer 154b can be formed (refer to FIG. 4F).

The light emitting structure 155 can include a first conductivity type semiconductor layer 155a, an active layer 155b, and a second conductivity type semiconductor layer 155c.

The first conductivity type semiconductor layer 155a can be implemented as a group III-V compound semiconductor doped with a first conductivity type dopant, and when the first conductivity type semiconductor layer 155a is an n-type semiconductor layer, the first conductivity type dopant is an n-type dopant and can include Si, Ge, Sn, Se, or Te, but is not limited thereto.

The active layer 155b is a layer in which electrons injected through the first conductivity type semiconductor layer 155a and holes injected through the second conductivity type semiconductor layer 113 meet each other to emit light having energy determined by the bandgap energy inherent to the active layer material.

The active layer 155b can be formed of at least one of a single quantum well structure, a multi quantum well (MQW) structure, a quantum wire structure, or a quantum dot structure.

The well layer/barrier layer of the active layer 155b can have a pair structure of one or more of InGaN/GaN, InGaN/InGaN, GaN/AlGaN, InAlGaN/GaN, GaAs(InGaAs)/AlGaAs, GaInP/AlGaInP, GaP/AlGaP and InGaP/AlGaP, but is not limited thereto.

The second conductivity type semiconductor layer 155c can include a group III-group V compound semiconductor, for example, a semiconductor material having a composition formula of $In_xAl_yGa_{1-x-y}N$ ($0 \leq x \leq 1$, $0 \leq y \leq 1$, $0 \leq x \leq y \leq 1$) doped with a second conductivity type dopant. When the second conductivity type semiconductor layer 155c is a p-type semiconductor layer, the second conductivity type dopant is a p-type dopant and can include Mg, Zn, Ca, Sr, Ba, or the like.

The light-transmitting electrode layer 156 can include an ohmic layer in which a single metal, a metal alloy, or a metal oxide is multi-layered so as to efficiently inject carriers. For example, the light-transmitting electrode layer 156 can include at least one of Ni/IrOx/Au and Ni/IrOx/Au/ITO, but is not limited to these materials. For example, the light-transmitting electrode layer 156 can include at least one of ITO(indium tin oxide), IZO(indium zinc oxide), IZTO(indium zinc tin oxide), IAZO(indium aluminum zinc oxide), IGZO(indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), In-Ga ZnO (IGZO), ZnO, IrOx, RuOx, NiO, RuOx/ITO, Ni/IrOx/Au or Ni/IrOx/Au/ITO, but is not limited to these materials.

Next, a mask material 201a can be formed on the light-transmitting electrode layer 156 as shown in FIG. 4B, and a mask pattern 201b for etching the epitaxial layer can be formed as shown in FIG. 4C.

For example, the mask pattern 201b can be formed by a process such as photolithography, polymer transfer, or nanoimprint.

Accordingly, the mask pattern 201b can be an imprint material including a photosensitive material, a polymer material, or a metal-based or oxide-based material, but is not limited thereto.

Next, as shown in FIG. 4D, Portions of the light-transmitting electrode 156, the light emitting structure 155, the second semiconductor layer 154a, and the first semiconductor layer 153 can be etched using the mask pattern 201b. The etching process can be chemically or physically etched through ICP, RIE equipment, and the like.

At this time, the side surface of the second semiconductor layer 154a is exposed, and the mask pattern 201b can become a post structure 201P. The post structure 201P can be referred to as a contact layer, a support layer, or an anchor layer, but is not limited thereto.

Next, as shown in FIG. 4E, an etching electrode 201E is formed using a conductive material on the light-transmitting electrode layer 156 without the post structure 201P.

Next, as shown in FIG. 4F, electrical chemical (EC) etching can be performed while applying positive (+) power to the etching electrode and applying negative (−) power to the oxalic acid solution in the oxalic acid solution.

Through this, the tether layer 154b can be formed by selectively etching the second semiconductor layer 154a having a high dopant concentration as shown in FIG. 4G. The tether layer 154b can be a friable layer easily broken by a predetermined pressure, and can be referred to as a separating layer or an etched layer, but is not limited thereto.

First Embodiment

Next, FIGS. 6A to 6D are diagrams illustrating a process according to the first embodiment of transferring the first semiconductor light emitting device 150RS including the post structure 201P shown in FIG. 5 to the donor substrate 310. Hereinafter, 'first embodiment' is referred to as 'embodiment'.

In the embodiment, a process in which the semiconductor light emitting device is firstly transferred to a predetermined donor substrate 310 or a transfer substrate and then secondarily transferred to the panel substrate 110 will be described, but is not limited thereto.

Referring to FIG. 6A, as a predetermined pressure is applied to the donor substrate 310 after the first semiconductor light emitting device 150RS including the post structure 201P is disposed on the donor substrate 310, as shown in FIG. 6B, the first semiconductor light emitting device chip structure 150RC having the post structure 201P remains on the donor substrate 310.

FIG. 6D is a photograph of the first semiconductor light emitting device chip structure 150RC in which the post structure 201P is coupled to the donor substrate 310 as shown in FIG. 6B.

FIG. 6C is a diagram explaining the principle of removing the first semiconductor layer 153 and the growth substrate 151 while the tether layer 154b is damaged in FIGS. 6A and 6B.

For example, referring to FIG. 6C (a), when pressure is applied after the first semiconductor light emitting device 150RS including the post structure 201P is disposed on the donor substrate 310, as shown in FIG. 6C (b), when the tether layer 154b is damaged, the first semiconductor layer 153 and the growth substrate 151 can be physically separated and removed.

The tether layer 154b damaged by the pressure loses adhesive strength, and the post structure 201P can be more strongly adhered to the donor substrate 310 due to adhesive strength and bonded thereto.

Next, FIGS. 7A to 7D are process diagrams in which the second semiconductor light emitting device chip structure 150GC including the post structure 201P and the third semiconductor light emitting device chip structure 150BC including the post structure 201P are transferred onto the donor substrate 310.

Also, FIG. 8 is a photograph of the first to third semiconductor light emitting device chip structures 150RC, 150GC, and 150BC including the post structure 201P coupled to the donor substrate 310 as shown in FIG. 7D.

The second semiconductor light emitting device chip structure 150GC and the third semiconductor light emitting device chip structure 150BC can be a semiconductor light emitting device chip structure emitting green light and a semiconductor light emitting device chip structure emitting blue light, respectively, but are not limited thereto.

First, referring to FIGS. 7A and 7B, as a predetermined pressure is applied to the donor substrate 310 after the second semiconductor light emitting device 150GS including the post structure 201P is disposed on the donor substrate 310, the tether layer 154b is damaged, and the growth substrate 151 is physically separated and removed. Accordingly, the second semiconductor light emitting device chip structure 150GC including the post structure 201P remains on the donor substrate 310.

At this time, since the height of the second semiconductor light emitting device 150GS including the post structure 201P is higher than that of the first semiconductor light emitting device chip structure 150RC bonded to the donor substrate 310, there is a special technical effect that the transfer process can stably proceed while the second semiconductor light emitting device 150GS including the post structure 201P contacts the donor substrate 310 due to the height difference.

Referring to FIGS. 7C and 7D, after the third semiconductor light emitting device 150BS including the post structure 201P is disposed on the donor substrate 310, as a predetermined pressure is applied to the donor substrate 310, the tether layer 154b is damaged and the growth substrate 151 is physically separated and removed. The third semiconductor light emitting device chip structure 150BC including the post structure 201P remains on the donor substrate 310.

Next, FIGS. 9A to 9E are process diagram of transferring electrode layers to the panel substrate 110 after forming electrode layers for the first to third semiconductor light emitting device chip structures 150RC, 150GC, 150BC having the post structure 201P coupled to the donor substrate 310 shown in FIG. 7D.

First, referring to FIG. 9A, an electrode material is formed on the first to third semiconductor light emitting device chip structures bonded to the donor substrate, the first-A electrode layer 121A, the second-A electrode layer 122A, and the third-A electrode layer 123A can be respectively formed.

For example, on the first to third semiconductor light emitting device chip structures 150RC, 150GC, and 150BC coupled to the donor substrate 310, a first-A electrode layer 121A, a second-A electrode layer 122A, and a third-A electrode layer 123A can be respectively formed by performing a deposition process of the at least one metal material among copper (Cu), titanium (Ti), chromium (Cr), nickel (Ni), aluminum (Al), platinum (Pt), gold (Au), tungsten (W), or molybdenum (Mo).

At this time, in the first to third semiconductor light emitting device chip structures 150RC, 150GC, and 150BC of the embodiment, as the horizontal width of the first conductivity type semiconductor layer 155a is designed to be larger than the horizontal width of the second conductivity type semiconductor layer 155c, in the process of forming the electrode material, the first-A electrode layer 121A, the second-A electrode layer 122A, and the third-A electrode layer 123A can be formed as a single layer or a plurality of layers without a separate mask process.

That is, in the first to third semiconductor light emitting device chip structures 150RC, 150GC, and 150BC of the embodiment, since the horizontal width of the first conductivity type semiconductor layer 155a is designed to be larger than the horizontal width of the second conductivity type semiconductor layer 155c, in the deposition process of metal materials, as the metal material is formed on the first conductivity type semiconductor layer 155a of the first to third semiconductor light emitting device chip structures 150RC, 150GC, and 150BC and not being formed on the second conductivity type semiconductor layer 155c, an electrical short may not occur.

Also, a metal material can be formed on the donor substrate 310 exposed between the first to third semiconductor light emitting device chip structures 150RC, 150GC, and 150BC.

In particular, according to the embodiment, the first conductivity type semiconductor layer 155a exposed after the tether layer 154b is removed as shown in FIG. 6D has a surface roughness as shown in FIG. 6D, and since the deposition of the metal layer is effectively progressed by such roughness, the contact force of the metal layer is excellent, and the contact area is increased, so that there is a technical effect that electrical characteristics are remarkably improved.

As shown in FIG. 6D, the roughness of the exposed first conductivity type semiconductor layer 155a of the first semiconductor light emitting device chip structure 150RC can have a growth ring shape, but is not limited thereto.

Also, according to the embodiment, bonding between the first-A electrode layer 121A, the second-A electrode layer 122A, and the third-A electrode layer 123A and the first-B electrode layer 121B, the second-B electrode layer 122B, and the third-B electrode layer 123B formed later proceeds efficiently, when removing the donor substrate, there is a special technical effect that the post structure 201P portion can be removed by maximizing the bonding force of the first wiring electrode 121, the second wiring electrode 122, and the third wiring electrode 123.

Next, referring to FIG. 9B, the first-B electrode layer 121B, the second-B electrode layer 122B, and the third-B electrode layer 123B can be formed as a single layer or a plurality of layers on the panel substrate 110.

The first-B electrode layer 121B, the second-B electrode layer 122B, and the third-B electrode layer 123B can include one or more metal materials selected from Copper (Cu), Titanium (Ti), Chromium (Cr), Nickel (Ni), Aluminum (Al), Platinum (Pt), Gold (Au), Tungsten (W) or Molybdenum (Mo).

Thereafter, a bonding process is performed by pressing the first to third semiconductor light emitting device chip structures 150RC, 150GC, and 150BC on which the first-A electrode layer 121A, the second-A electrode layer 122A, and the third-A electrode layer 123A are formed onto the first-B electrode layer 121B, second-B electrode layer 122B, and third-B electrode layer 123B on the panel substrate 110, as shown in FIG. 9C, a first wiring electrode 121, a second wiring electrode 122, and a third wiring electrode 123 are formed, and the first to third semiconductor light emitting device chip structures 150RC, 150GC, and 150BC can be coupled to the panel substrate 110 by the first to third wiring electrodes 121, 122, and 123.

Next, as shown in FIG. 9d, when the donor substrate 310 is moved in the opposite direction to the panel substrate 110, the post structure 201P and the first to third semiconductor light emitting device chip structures 150RC, 150GC, and 150BC are separated, so that as shown in FIG. 9E, the first to third semiconductor light emitting device chip structures 150RC, 150GC, and 150BC remain on the panel substrate 110.

According to the embodiment, due to the strong bonding strength between the first wiring electrode 121, the second wiring electrode 122, and the third wiring electrode 123 formed by a bonding process by pressing on the first-B electrode layer 121B, the second-B electrode layer 122B, and the third-B electrode layer 123B, the metal layer, when the donor substrate 310 is removed, as the post structure 201P and the first to third semiconductor light emitting device chip structures 150RC, 150GC, and 150BC are separated from each other, as shown in FIG. 9E, the transferred first to third semiconductor light emitting device chip structures 150RC, 150GC, and 150BC can be formed on the panel substrate 110.

In particular, in the embodiment, by providing roughness on the exposed first conductivity type semiconductor layer 155a of the first to third semiconductor light emitting device chip structures 150RC, 150GC, and 150BC, bonding between the first-A electrode layer 121A, the second-A electrode layer 122A, and the third-A electrode layer 123A and the first-B electrode layer 121B, the second-B electrode layer 122B, and the third-B electrode layer 123B formed later can be efficiently performed.

Also, according to the embodiment, as roughness is provided on the exposed first conductivity type semiconductor layer 155a of the first to third semiconductor light emitting device chip structures 150RC, 150GC, and 150BC and the deposition of the metal layer proceeds effectively by this roughness, the contact force of the metal layer is excellent, and the contact area is increased, so that there is a technical effect of significantly improving electrical characteristics.

Next, referring to FIG. 3, the first to third semiconductor light emitting devices 150R, 150G, and 150B can be formed by forming an insulating layer 130 between the first to third semiconductor light emitting device chip structures 150RC, 150GC, and 150BC.

Meanwhile, in the embodiment, the bonding process can be performed while the insulating layer 130 is previously formed on the panel substrate 110 of FIG. 9B, but is not limited thereto.

According to the manufacturing method of the semiconductor light emitting device package according to the embodiment, the semiconductor light emitting device package manufactured by the method, and a display device including the same, there is a technical effect that enables efficient transcription and transmission in ultra-small LED chips applied to high-resolution displays such as AR and VR.

Also, according to the embodiment, there is no need to manufacture a dedicated transfer head and a dedicated stamp due to the smaller chip size of the semiconductor light emitting device.

Also, according to the embodiment, there is a technical effects capable of transferring all R, G, and B chips to the donor substrate and improving the uniformity of the display by metal bonding R, G, and B chips to the panel substrate at the same time.

Also, according to the embodiment, there is a technical effect capable of implement a full-color small display with high resolution by reducing the size and pitch of a semiconductor light emitting device chip.

Also, according to the embodiment, there is a technical effect in which a metal layer can be formed on the LED chip so as to have excellent electrical characteristics without an electrical short on the LED chip, even on a subminiature LED chip.

Second Embodiment

FIGS. TOA to 10C show a transfer method according to the second embodiment, are a process diagram in which the first semiconductor light emitting device chip structure 150RC including the post structure 201P is transferred onto the donor substrate 310 having the coating layer 320 thereon.

Referring to FIG. 10A, a coating layer 320 can be further formed on the donor substrate 310. The coating layer 320 can be formed of a photosensitive material or a resin or polymer material.

The coating layer 320 can be thermally deformed, and can be integrated with the post structure 201P on the first semiconductor light emitting device chip structure 150RC.

Referring to FIG. 10A, by forming the coating layer 320 on the donor substrate 310, it can be combined with and integrated with the post structure 201P on the first semiconductor light emitting device chip structure 150RC.

FIG. 10D is a photograph in which the post structure 201P of the first semiconductor light emitting device chip structure 150RC is inserted into the coating layer 320 on the donor substrate and combined.

According to the embodiment, as the post structure 201P digs into the coating layer 320 and is inserted, when the tether layer 154b is damaged, the first semiconductor light emitting device chip structure 150RC can be efficiently transferred to the donor substrate 310 by strong bonding force between the coating layer 320 and the post structure 201P.

According to the embodiment, when pressure is applied to break the tether layer 154b, as the post structure 201P digs into the coating layer 320 and is inserted, the effect of the pressure on the structure of the light emitting device is minimized, thereby improving reliability of the light emitting device chip.

Next, referring to FIG. 10B, a coating layer pattern 320P can be further formed on the donor substrate 310. The coating layer pattern 320P can be formed of a photosensitive material or a resin or polymer material.

The coating layer pattern 320P can be thermally deformed, and can be combined and integrated with the post structure 201P on the first semiconductor light emitting device chip structure 150RC.

Referring to FIG. 10B, by forming a thick second coating layer pattern 320P2 on the donor substrate 310, there is a technical effect that allows selective transcription of transferring the first chip structure 150RC1 of the first semiconductor light emitting device corresponding to the coating layer pattern 320P among the first semiconductor light emitting device chip structures 150RC, but the second chip structure 150RC2 of the first semiconductor light emitting device that does not correspond to the coating layer pattern 320P is not transferred.

Next, referring to FIG. 10C, a thick second coating layer pattern 320P2 can be further formed on the donor substrate 310. The second coating layer pattern 320P2 can be formed of a photosensitive material or a resin or polymer material.

The thickness of the second coating layer pattern 320P2 may be in the range of 0.5 to 1.0 of the thickness of the post structure 201P.

Referring to FIG. 10C, by forming a thick second coating layer pattern 320P2 on the donor substrate 310, there is a technical effect that allows selective transcription of transferring the first chip structure 150RC1 of the first semiconductor light emitting device corresponding to the coating layer pattern 320P among the first semiconductor light emitting device chip structures 150RC, but the second chip structure 150RC2 of the first semiconductor light emitting device that does not correspond to the coating layer pattern 320P is not transferred.

Also, according to the embodiment, when there is bowing in the panel substrate or the donor substrate, there is a special technical effect of improving the transfer yield.

According to the manufacturing method of the semiconductor light emitting device package according to the embodiment, the semiconductor light emitting device package manufactured by the method, and a display device including the same, there is a technical effect that enables efficient transcription and transmission in ultra-small LED chips applied to high-resolution displays such as AR and VR.

Also, according to the embodiment, there is no need to manufacture a dedicated transfer head and a dedicated stamp due to the smaller chip size of the semiconductor light emitting device.

Also, according to the embodiment, all R, G, and B chips can be transferred to the donor substrate, and R, G, and B chips can be simultaneously metal bonded to the panel substrate, so there is a technical effect of improving the uniformity of the display.

Also, according to the embodiment, there is a technical effect capable of implement a small full-color display with high resolution by reducing the size and pitch of a semiconductor light emitting device chip.

Also, according to the embodiment, there is a technical effect in which a metal layer can be formed on the LED chip so as to have excellent electrical characteristics without an electrical short on the LED chip even for a subminiature LED chip.

The semiconductor light emitting device according to the embodiment is not limited to the micro LED, and includes mini LED.

The semiconductor light emitting device according to the embodiment can be applied to an LED having a relatively large area for illumination and signage also to the micro LED display.

Also, a method for manufacturing a semiconductor light emitting device package according to an embodiment, a semiconductor light emitting device package manufactured by the method, and a display device including the same can include Digital TVs, mobile phones, smart phones, laptop computers, digital broadcasting terminals, PDAs (personal digital assistants), a PMP (portable multimedia player), a navigation, a slate PC, a tablet PC, an ultra-book, a desktop computer, etc.

The above description is merely an example of the technical idea of the embodiment, and various modifications and variations can be made to those skilled in the art without departing from the essential characteristics of the embodiment.

Therefore, the embodiments disclosed in the embodiments are not intended to limit the technical idea of the embodiment but to explain, and the scope of the technical idea of the embodiment is not limited by these examples.

The protection scope of the embodiment should be interpreted according to the claims below, and all technical ideas within the scope equivalent thereto should be construed as being included in the scope of rights of the embodiment.

The invention claimed is:

1. A manufacturing method of semiconductor light emitting device package comprising:

a step of manufacturing a first semiconductor light emitting device including a post structure on a light emitting structure;

a step of transferring the first semiconductor light emitting device including the post structure onto a donor substrate;

a step of removing a growth substrate by damaging a tether layer of the first semiconductor light emitting device including the post structure, and a step of forming a first-A electrode layer on the light emitting structure exposed after removal of the growth substrate, wherein the light emitting structure comprises a first conductivity type semiconductor layer, an active layer, and a second conductivity type semiconductor layer, and wherein a horizontal width of the first conductivity type semiconductor layer of the light emitting structure is greater than a horizontal width of the second conductivity type semiconductor layer, and the first-A electrode layer is formed on the first conductivity type semiconductor layer.

2. The manufacturing method of semiconductor light emitting device package according to claim 1, wherein the step of manufacturing the first semiconductor light emitting device including the post structure comprises a step of sequentially forming a first semiconductor layer on the growth substrate, a second semiconductor layer on the first semiconductor layer, a light emitting structure on the second semiconductor layer, and a light transmitting electrode layer on the light emitting structure;

a step of forming a mask pattern on the light transmitting electrode layer;

a step of etching portions of the light transmitting electrode layer, the light emitting structure, the second semiconductor layer, and the first semiconductor layer and forming the mask pattern into a post structure;

a step of forming an etching electrode on the light transmitting electrode layer without the post structure, and a step of forming a tether layer by selectively partially etching the second semiconductor layer by performing EC (Electrical chemical) etching.

3. The manufacturing method of semiconductor light emitting device package according to claim 2, wherein the first semiconductor layer and the second semiconductor layer are each doped with a first conductivity type dopant, and wherein a doping concentration of the first conductivity type dopant of the second semiconductor layer is higher than that of the first conductivity type dopant of the first semiconductor layer.

4. The manufacturing method of semiconductor light emitting device package according to claim 3, wherein the step of removing the growth substrate by damaging the tether layer of the first semiconductor light emitting device including the post structure is configured that the tether layer of the first semiconductor light emitting device is damaged and the growth substrate is removed, so that the first semiconductor light emitting device chip structure including the post structure remains on the donor substrate after the first semiconductor light emitting device including the post structure is disposed on the donor substrate, as a predetermined pressure is applied to the donor substrate.

5. The manufacturing method of semiconductor light emitting device package according to claim 1, wherein the exposed first conductivity type semiconductor layer has roughness on an exposed surface after the tether layer is removed.

6. The manufacturing method of semiconductor light emitting device package according to claim 5, further comprising a step of bonding the first semiconductor light emitting device chip structure including the first-A electrode layer on a panel substrate including a first-B electrode layer.

7. The manufacturing method of semiconductor light emitting device package according to claim 6, further comprising a step of separating the post structure from the light emitting structure.

8. The manufacturing method of semiconductor light emitting device package according to claim 1, further comprising a coating layer on the donor substrate.

9. The manufacturing method of semiconductor light emitting device package according to claim 1, further comprising a coating layer pattern on the donor substrate.

10. A semiconductor light emitting device package comprising:

a tether layer on a first semiconductor layer;

a light emitting structure on the tether layer;

a light transmitting electrode layer on the light emitting structure; and a post structure on the light transmitting electrode layer, wherein the semiconductor light emitting device package is configured to be manufactured by the manufacturing method of claim 1.

* * * * *